United States Patent [19]

Goronkin et al.

[11] Patent Number: 5,270,225
[45] Date of Patent: Dec. 14, 1993

[54] METHOD OF MAKING A RESONANT TUNNELING SEMICONDUCTOR DEVICE

[75] Inventors: Herbert Goronkin, Tempe; Jun Shen, Phoenix; Saied Tehrani, Scottsdale, all of Ariz.

[73] Assignee: Motorola, Inc., Schaumburg, Ill.

[21] Appl. No.: 838,955

[22] Filed: Feb. 21, 1992

[51] Int. Cl.⁵ .......................................... H01L 21/265
[52] U.S. Cl. ...................................... 437/31; 437/129;
437/133; 257/9; 257/14; 257/19; 257/21;
257/25; 257/104
[58] Field of Search ................... 437/31, 59, 129, 133;
257/9, 104, 105, 106, 14, 19, 21, 25

[56] References Cited

U.S. PATENT DOCUMENTS

| | | | |
|---|---|---|---|
| 4,840,446 | 6/1989 | Nakamura et al. | 257/21 |
| 4,887,274 | 12/1989 | Hayakawa et al. | 257/21 |
| 5,016,064 | 5/1991 | Goronkin | 257/14 |
| 5,059,545 | 10/1991 | Frensley et al. | 437/129 |
| 5,060,234 | 10/1991 | Schubert et al. | 257/21 |
| 5,068,867 | 11/1991 | Hasenberg et al. | 257/21 |
| 5,179,037 | 1/1993 | Seabaugh | 437/133 |
| 5,185,647 | 2/1993 | Vasquez | 257/21 |

OTHER PUBLICATIONS

Seabaugh et al. Room Temperature Hot Electron Transistors with InAs-Notched Resonant-Tunneling-Diode Injector, Japanese Journal of Applied Physics, vol. 30, No. 5, May, 1991, pp. 921-925.

*Primary Examiner*—Olik Chaudhuri
*Assistant Examiner*—Ramamohan Rao Paladugu
*Attorney, Agent, or Firm*—Joe E. Barbee

[57] ABSTRACT

A resonant tunneling semiconductor device having two large bandgap barrier layers (12, 14) separated by a quantum well (13) is provided. The two barriers (12,14) and the quantum well (13) are formed between first and second semiconductor layers (11, 16) of a first conductivity type. A monolayer (17) of material having a different bandgap than the quantum well material is provided in the quantum well thereby lowering the ground state energy level of the quantum well. Alternatively, monolayers (18, 19) having a different bandgap than that of the first and second semiconductor layers (11, 16) are formed in the first and second semiconductor layers, respectively, outside of the quantum well (13).

12 Claims, 2 Drawing Sheets

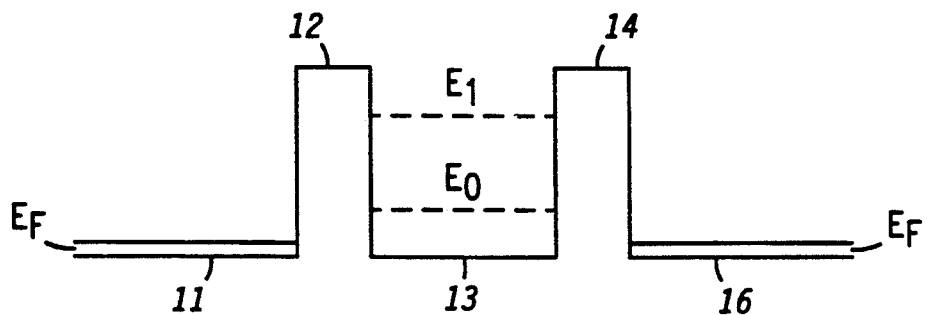
FIG. 2
-PRIOR ART-
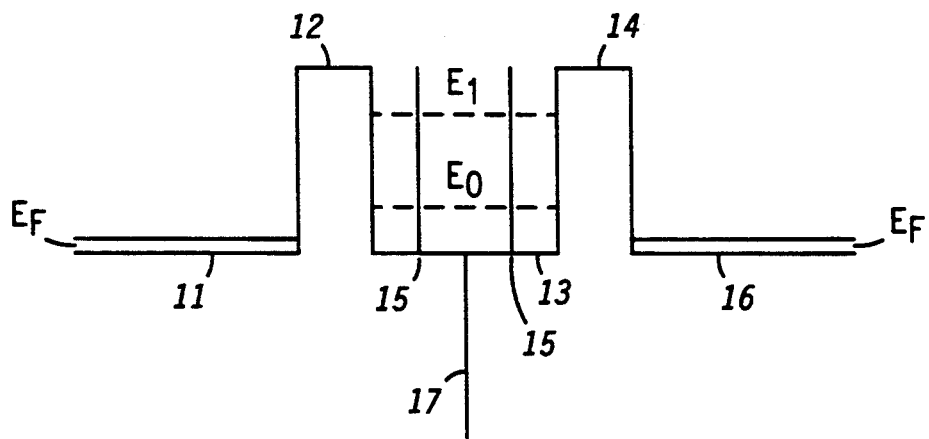
FIG. 3
FIG. 4
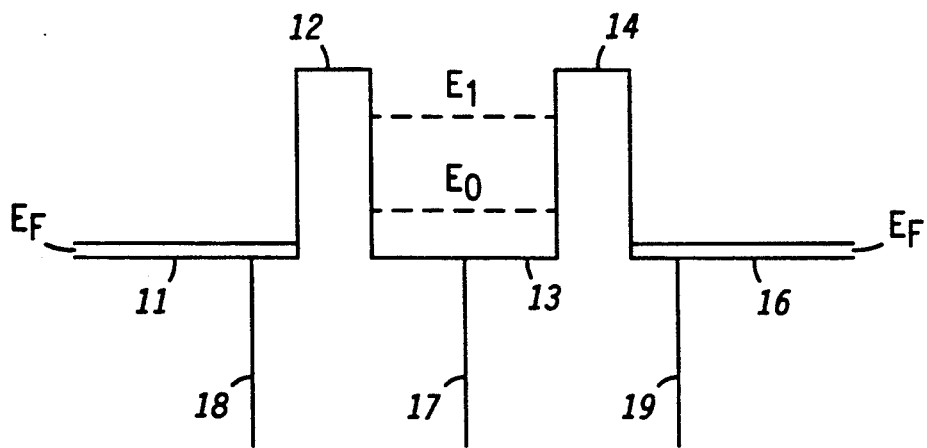

METHOD OF MAKING A RESONANT TUNNELING SEMICONDUCTOR DEVICE

BACKGROUND OF THE INVENTION

The present invention relates, in general, to semiconductor devices, and more particularly, to resonant tunneling semiconductor devices.

Resonant tunneling diodes and transistors are used in high-performance digital and analog circuits. In the past, resonant tunneling transistors are made by placing a resonant tunneling diode in an emitter contact structure or in the base of a bipolar transistor. Resonant tunneling diodes have two high bandgap barrier layers separated by a quantum well. The quantum well has a ground state energy level $E_0$ and a first quantized energy level $E_1$. Outside the two barrier layers, low bandgap material is provided where available charge carriers exist with a Fermi Energy ($E_F$). Relative energy difference between $E_F$, $E_0$ and $E_1$ is determined by bias applied to the device.

In normal operation, current only flows through the resonant tunneling diode, or through the emitter of a resonant tunneling transistor, by tunneling through the two barrier layers and travelling through the quantum well. Because charge carriers can only travel through the quantum well if they are at an energy approximately equal to $E_0$ or $E_1$, the quantum well impedes current flow over a wide range of bias conditions. A "resonant" condition exists, however, when the structure is biased so that $E_F = E_0$ or $E_F = E_1$. In these resonant conditions, charge carriers tunnel through the first barrier, travel to the second barrier in the $E_0$ or $E_1$ energy level, then tunnel through the second barrier. This feature gives the resonant tunneling diode and transistor a highly non-linear current-voltage (I-V) characteristic with negative differential resistance finding utility in high frequency oscillators and both analog and digital circuits.

The high current density which flows in the resonant tunneling device during the resonant condition is called peak current. The relatively low current density which flows through the device in the non-resonant condition is called valley current. One problem with prior resonant tunneling devices is that the ratio of the peak current to the valley current is not as large as is desired for efficient circuits. To provide high current density devices, peak current should be large. This can be done by lowering the bandgap of the barrier layers, but this method results in larger valley current because the barriers do not impede current as well during the non-resonant condition. The large valley current, which is analogous to a leakage current in a conventional transistor or diode, is dissipated as heat in the device. Devices with large valley current are thus inefficient and create power dissipation and heat removal problems for circuit designers.

Another problem with existing resonant tunneling devices is that large peak-to-valley ratios are needed to provide a large negative differential conductance to obtain maximum frequency of oscillation. Large peak-to-valley ratios are also needed to provide reliable switching for analog and digital circuits.

What is needed is a resonant tunneling semiconductor device that allows for large peak currents while at the same time providing low valley currents.

SUMMARY OF THE INVENTION

Briefly stated, the present invention is achieved by a resonant tunneling semiconductor device having two large bandgap barrier layers separated by a quantum well. The two barriers and the quantum well are formed between first and second semiconductor layers. A monolayer of material having a different bandgap than the quantum well material is provided in the quantum well thereby lowering the ground state energy level of the quantum well. Alternatively, monolayers having a different bandgap than that of the first and second semiconductor layers are formed in the first and second semiconductor layers, respectively, outside of the quantum well.

The term "monolayer" is used herein to mean a very thin layer of crystal material that is at least one but up to three atomic layers thick.

BRIEF DESCRIPTION OF THE DRAWINGS

FIG. 2 is a portion of a schematic band diagram of a prior art resonant tunneling device;

FIG. 3 is a portion of a schematic band diagram of a resonant tunneling device in accordance with the present invention; and FIG. 4 is a portion of a schematic band diagram of a second embodiment resonant tunneling device in accordance with the present invention.

DETAILED DESCRIPTION OF THE DRAWINGS

Figure 1:
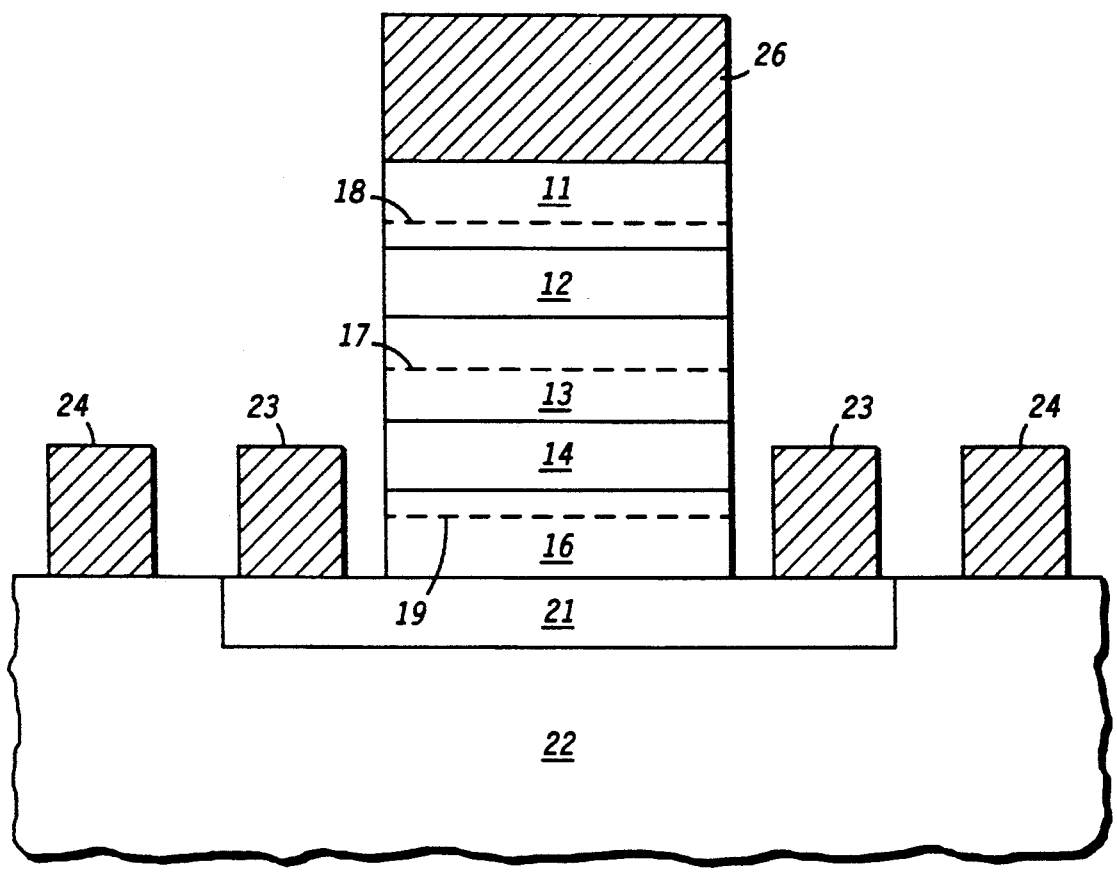
FIG. 1 is a highly enlarged cross-section view of a portion of a resonant tunneling transistor in accordance with the present invention.

FIG. 1 shows a highly enlarged cross-sectional view of a resonant tunneling device in accordance with the present invention. Although the preferred embodiments are described in terms of specific material compositions, it should be understood that actual material compositions can be altered significantly so long as relationships between bandgap energy satisfy the conditions set out hereinafter. A first spacer layer 16 and a second spacer layer 11 comprise a semiconductor material having a moderate to low bandgap energy. For example, spacer layers 11 and 16 may comprise gallium arsenide (GaAs). Spacer layers 11 and 16 may be doped, but in a preferred embodiment at least an upper portion of spacer layer 16 and a lower portion of spacer layer 11 are undoped. Quantum well layer 13 also comprises a moderate bandgap material which is preferably undoped. Quantum well layer 13 comprises, for example, undoped GaAs.

First barrier 14 and second barrier 12 comprise a material having a larger bandgap energy than that of spacer layers 11 and 16. Quantum well layer 13 is formed between first barrier 14 and second barrier 12 to form a quantum well. Spacer layers 11 and 16, together with barrier layers 12 and 14 and quantum well layer 13 form a resonant tunneling diode.

As illustrated in FIG. 1, the resonant tunneling diode can be formed so that spacer layer 16 couples to a base region 21 which is of an opposite conductivity type semiconductor material from the bottom portion of spacer layer 16. Base region 21 is formed in a collector region 22 which comprises a semiconductor material of the same conductivity type as the bottom portion of spacer layer 16. Collector region 22 and base region 21 together form a substrate on which a resonant tunneling device structure can be formed. To form only a resonant tunneling diode, base region 21 is omitted. Conductivity type, doping concentration, and bandgap energy of the substrate will vary according to the particular application. It is sufficient if the substrate comprises a single crystal semiconductor material, such as GaAs, upon which the overlying layers shown in FIG. 1 can be formed by epitaxial growth techniques.

An emitter electrode 26 is formed covering spacer layer 11. Similarly, collector electrodes 24 are formed coupled to collector region 22 and base electrodes 23 are formed coupled to base region 21. Metal deposition and patterning techniques for forming electrodes 23, 24, and 26 are well known in the semiconductor arts. It is usually necessary to provide low resistivity regions at the interface of electrodes 23, 24, and 26 with the semiconductor material to which they couple. Methods of providing such low resistivity regions, such as ion implantation and diffusion, are also well known. It should be understood that the cross-section shown in FIG. 1 is highly simplified, and actual device structures can vary widely from the particular geometries illustrated.

Also shown in FIG. 1 are monolayers 18 and 19, indicated by dashed lines, which are formed in spacer layers 11 and 16, respectively. Monolayers 18 and 19 comprise a material having a different bandgap energy—either larger or smaller—than the bandgap energy of spacer layers 11 and 16. For example, Monolayers 18 and 19 may comprise indium arsenide (InAs) to provide a bandgap energy less than GaAs, or may comprise aluminum arsenide (AlAs) to provide a bandgap energy larger than GaAs. In a preferred embodiment monolayer 18 is placed approximately thirty angstroms from the interface between barrier layer 12 and spacer layer 11. Likewise, monolayer 19 is placed approximately thirty angstroms from the interface of spacer layer 16 with barrier layer 14. These spacings are only exemplary, however, as spacing depends on barrier height and dimensions of barrier layer 14 and quantum well 13. Other spacings may be used within the scope of the present invention.

Another feature of the resonant tunneling device in accordance with the present invention is monolayer 17 formed in a central portion of quantum well 13, indicated by a dashed line in FIG. 1. Monolayer 17 comprises a material having a smaller bandgap energy than the bandgap energy of quantum well 13 For example, monolayer 17 may comprise InAs. More than one monolayer 17 can be provided inside quantum well 13, as is discussed more fully in reference to FIG. 3.

The effect of monolayer 17, as well as monolayers 18 and 19 are best described in reference to schematic band diagrams shown in FIGS. 2-4. The conduction band energies illustrated in FIGS. 2-4 are identified by reference numbers which correspond to device regions shown in the cross section in FIG. 1. FIG. 2 shows a schematic band diagram of the conduction band of a prior art resonant tunneling device. The prior art structure shown in FIG. 2 does not contain monolayers 17, 18, or 19. Quantum well 13 has a quantized ground state energy level $E_0$ and a first excited energy level $E_1$, illustrated by dashed lines in FIGS. 2-4. Charge carriers can easily travel through quantum well 13 only if they have energy equal to $E_0$ or $E_1$.

Charge carriers moving in the conduction band in either spacer layer 11 or spacer layer 16 can pass through barriers 12 and 14 by tunneling. However, unless these electrons have an energy equal to $E_0$ or $E_1$, the probability of their passing through quantum well 13 is extremely low. Charge carriers in spacer layers 11 and 16 exist at a Fermi energy ($E_F$) illustrated by the indicated regions in FIGS. 2-4. A bias applied to spacer layer 11 or spacer layer 16 will modify relative energy difference between $E_F$ and $E_0$ and $E_1$. By modifying the energy difference, $E_F$ can be aligned with $E_0$ providing a "resonant" condition during which charge carriers can tunnel through barriers 12 and 14, through quantum well 13, so that current can flow between spacer layer 11 and spacer layer 16.

As additional bias is applied, $E_F$ becomes larger than $E_0$ and the resonant condition is destroyed. When $E_F$ becomes equal to $E_1$, a second resonant condition is satisfied and large current density flows again. Thus, the current-voltage (I-V) characteristic for the device has two peaks corresponding to $E_F=E_0$ and $E_F=E_1$ and a valley where $E_1 > E_F > E_0$.

Ideally, zero current flows except in the resonant condition, in which case a large current will flow. In reality, however, some parasitic valley current flows even in the non-resonant condition due to finite transmission probability, thermionic emission over the barrier, and other phonon-assisted and impurity assisted tunneling. It has been found that the resonant tunneling device in accordance with the present invention greatly reduces the valley current and improves the ratio of the peak current to the valley current.

FIG. 3 illustrates a schematic band diagram of a first embodiment resonant tunneling device in accordance with the present invention. Monolayer 17 is formed in a central portion of quantum well 13, and comprises a material with a smaller bandgap energy than quantum well 13. More than one monolayer 17 may be used. The effect of the lower bandgap monolayer 17 is to lower $E_0$ substantially in quantum well 13 as compared to the structure shown in FIG. 2. Monolayer 17 has an insignificant effect on the $E_1$ energy level when a single monolayer 17 is placed near the center of quantum well 13.

While the most obvious effect of lowering $E_0$ is to alter the bias at which the resonant condition $E_F=E_0$ occurs, a more surprising result is that the presence of monolayer 17 reduces the valley current substantially while only minimally reducing the peak current. In principle, valley current is reduced if the energy separation between $E_0$ and $E_1$ is increased. A monolayer 17 which comprises a material having a smaller bandgap than quantum well 13 lowers $E_0$, and is preferably placed near the center of quantum well 13. One or more monolayers 15 comprising a material having a larger bandgap than quantum well 13 have the effect of raising $E_1$. The preferred position for a monolayers 15 having a larger bandgap than quantum well 13 is midway between the center and the edge of quantum well 13.

One or more monolayers 15 and 17 having both larger and smaller bandgaps than quantum well 13 may be used. Thus, using several monolayers 15 and 17, the separation between $E_0$ and $E_1$ can be easily tailored to meet a particular application, and simultaneously reduce valley current and improve peak-to-valley current ratio. In an example structure, one InAs monolayer 17 inserted near the center of a GaAs quantum well 13 improved peak-to-valley current ratio by a factor of nearly two, primarily through a reduction of valley current.

It has also been found that monolayers 18 and 19 placed outside of quantum well 13, as shown in FIG. 4, further reduce valley current. Monolayers 18 and 19 do not have a significant effect on either $E_0$ or $E_1$ inside the quantum well, but appear to alter the ability of charge carriers to tunnel through quantum well 13 in the non-resonant condition by altering the phase of the wave function of the charge carriers. In an example structure, monolayers 18 and 19 comprising InAs inserted into spacer layers 11 and 16, respectively, comprising GaAs improved the peak-to-valley current ratio by a factor of almost two. Also, the effects of monolayers 17 and monolayers 18 and 19 are cumulative. In other words, using one monolayer 17 in conjunction with monolayers 18 and 19 resulted in an almost fourfold decrease in valley current.

Referring again to FIG. 1, a method of making a resonant tunneling semiconductor device in accordance with the present invention includes providing a substrate on which a resonant tunneling semiconductor device can be formed, such as collector region 22 and base region 21 shown in FIG. 1. Alternatively, a doped semiconductor substrate could be used to provide a simple resonant tunneling diode having an electrode coupled through the doped substrate to resonant tunneling device formed on the substrate. Next, spacer layer 16 having a top and a bottom is formed covering the substrate, and in the case of a resonant tunneling transistor is coupled to base region 21. Monolayer 19 is formed at a predetermined distance from the top of the spacer layer 16 during the formation of spacer layer 16.

First barrier layer 14 is formed covering spacer layer 16 and quantum well 13 is formed covering the barrier layer 14. Monolayer(s) 17 and 15 are provided in quantum well 13 during the step of forming quantum well 13. Quantum well 13 is covered by barrier layer 12 which is itself covered by spacer layer 11 Monolayer 18 is formed in the spacer layer 11 at a predetermined distance from barrier layer 12 during the step of forming spacer layer 11.

Layers 11-14, 16, and monolayers 17-19 can be provided using conventional epitaxial growth equipment and techniques such as metal organic chemical vapor deposition (MOCVD), atomic layer epitaxy (ALE), molecular beam epitaxy (MBE) and the like.

A method for using the resonant tunneling device of the present invention includes forming spacer layer 16 on base region 21 of a bipolar transistor or a heterojunction bipolar transistor, as illustrated in FIG. 1. To form a bipolar transistor or a hot electron transistor (HET), at least a bottom portion of spacer layer 16 is doped a first conductivity type. For example, a bottom portion of spacer 16 is doped N-type to form an emitter of an NPN transistor. For an NPN bipolar transistor, base region 21 comprises a semiconductor material doped a second conductivity type, or P-type for an NPN transistor. For an HET, base region 21 is not doped an opposite conductivity type. Collector region 22 in which base region 21 is formed comprises a semiconductor material of the first conductivity type. Collector region 22 may be a substrate, or may be a layer formed on another substrate. For ease of understanding, collector region 22 together with base region 21 are referred to as a substrate.

The resonant tunneling structure including a quantum well and monolayers 17, 18, and 19 is formed over spacer layer 16 as described hereinbefore. Electrode 26 is formed on spacer layer 11. Electrodes 23 are formed in contact with base 21, and collector electrodes 24 are formed coupled to collector region 22. Electrodes 23, 24 and 26 are formed by conventional metal deposition and patterning methods.

By now it should be appreciated that a resonant tunneling structure having improved peak-to-valley current ratio is provided. Further, the resonant tunneling device in accordance with the present invention provides reduced valley current, improved device linearity, and lower overall power dissipation. The resonant tunneling structure is manufactured using well-known epitaxial layer deposition techniques. The resonant tunneling device is useful in a method for making a resonant tunneling transistor with improved performance.

We claim:

1. A method of making a resonant tunneling semiconductor device comprising the steps of: providing a substrate on which a resonant tunneling semiconductor device can be formed; forming a first spacer layer having a top; forming a first monolayer in the first spacer layer a predetermined distance from the top of the first spacer layer; forming a first barrier layer covering the first spacer layer; forming a quantum well covering the first barrier layer; forming a second monolayer in a central portion of the quantum well; forming second barrier layer covering the quantum well; forming a second spacer layer; and forming a third monolayer in the second spacer layer at a predetermined distance from the second barrier layer.

2. The method of claim 1 wherein the step of providing a substrate further comprises: providing a collector region of a first conductivity type; and forming a base region of a second conductivity type in the collector region, wherein the step of forming a first spacer layer includes forming the first spacer layer coupled to the base region.

3. The method of claim 2 wherein the step of forming a first spacer layer further comprises: doping at least a bottom portion of the first spacer layer to the first conductivity type.

4. The method of claim 9 wherein the step of forming a first monolayer includes forming the first monolayer approximately thirty angstroms from the top of the first spacer layer.

5. The method of claim 4 wherein the step of forming a second monolayer includes forming the second monolayer approximately thirty angstroms from the second spacer layer.

6. A method for making a resonant tunneling device comprising the steps of: providing a substrate having a collector region of a first conductivity type and a base region of a second conductivity type in the collector region; and forming a resonant tunneling diode on top of the base region and electrically coupled to the base region, wherein the resonant tunneling diode includes a first spacer layer formed on the base region, wherein at least a bottom portion of the first spacer layer is doped to the first conductivity type; a quantum well formed on the first spacer layer; at least one monolayer formed at a central portion of the quantum well, wherein the at least one monolayer comprises a material having a higher bandgap energy than the quantum well; and forming a second spacer layer over the quantum well.

7. The method of claim 6 further comprising the steps of: forming an emitter electrode coupled to the second spacer layer; forming a base electrode coupled to the base region; and forming a collector electrode coupled to the collector region.

8. The method of claim 6 further comprising the step of forming at least one monolayer outside the quantum well in the first spacer layer comprising a material having a different bandgap energy than the first spacer layer.

9. The method of claim 8 further comprising the step of forming at least one monolayer outside the quantum well in the second spacer layer comprising a material having a different bandgap energy than the second spacer layer.

10. The method of claim 8 wherein the step of forming a quantum well further comprises forming a first and a second barrier layer of a wide bandgap material and forming narrow bandgap material between the first and second barrier layers.

11. A method for making a resonant tunneling semiconductor device comprising the steps of:

providing a substrate on which a resonant tunneling semiconductor device can be formed;

forming a first spacer layer;

forming a first barrier layer covering the first spacer layer;

forming a quantum well covering the first barrier layer;

forming a monolayer in a central portion of the quantum well, the monolayer having a higher bandgap energy than the quantum well;

forming a second barrier layer covering the quantum well; and forming a second spacer layer over the second barrier layer.

12. The method of claim 11, wherein the monolayer comprises aluminum arsenide.

* * * * *

UNITED STATES PATENT AND TRADEMARK OFFICE
CERTIFICATE OF CORRECTION

PATENT NO. : 5,270,225
DATED : December 14, 1993
INVENTOR(S) : Herbert Goronkin et al.

It is certified that error appears in the above-indentified patent and that said Letters Patent is hereby corrected as shown below:

Claim 4, column 6, line 39, "9" should read --1--.

Signed and Sealed this

Eleventh Day of October, 1994

Attest:

BRUCE LEHMAN

*Attesting Officer*   *Commissioner of Patents and Trademarks*